United States Patent [19]

Johannessen et al.

[11] Patent Number: 4,689,803
[45] Date of Patent: Aug. 25, 1987

[54] ANTENNA TUNING SYSTEM AND METHOD

[75] Inventors: Paul R. Johannessen, Lexington; Peter V. Planck, Sudbury, both of Mass.

[73] Assignee: Megapulse Inc., Bedford, Mass.

[21] Appl. No.: 742,744

[22] Filed: Jun. 10, 1985

[51] Int. Cl.⁴ .......................................... H04L 27/10
[52] U.S. Cl. ...................................... 375/63; 455/125
[58] Field of Search .................................. 375/62, 63; 455/121-123, 125, 170; 343/750; 330/8

[56] References Cited

U.S. PATENT DOCUMENTS

| | | | |
|---|---|---|---|
| 3,904,966 | 9/1975 | Firman | 375/63 |
| 3,939,422 | 2/1976 | Deise | 375/63 |
| 4,059,801 | 11/1977 | Johannessen et al. | 375/63 |
| 4,521,913 | 6/1985 | Huber et al. | 455/125 |
| 4,555,792 | 11/1985 | Van Tol | 375/62 |

OTHER PUBLICATIONS

Jacob, M. I. & Brauch, H. N., "Keying VLF Transmitters at High Speed", Electronics, vol. 27 (1954), No. 12, pp. 148-151.

"Controlled Antenna Reactor for Bandwidth Enhancement (CARBE)", RADC TR-74-161 (Jul. 1974), by Planck.

Primary Examiner—Robert L. Griffin
Assistant Examiner—Stephen Chin
Attorney, Agent, or Firm—Rines and Rines, Shapiro and Shapiro

[57] ABSTRACT

A dynamic antenna tuning system particularly adapted for VLF frequency-shift (as opposed to on-off) keyed transmitters, employing saturable magnetic switching amplifiers providing variable tuning inductance between the antenna and transmitter and controlled to effect a gradual and not abrupt switching of the radio frequency during on-off transitions to enable narrow VLF frequency spectrum operation.

4 Claims, 11 Drawing Figures $$B_{RF} = \frac{V_{RF} \sqrt{2}}{w \, A_{CORE} \, N_{RF}} \leq 7,800 \text{ GAUSS FOR "PERMALLOY"}$$

$$H_{RF} = \frac{N_{RF} \, I_{RF} \sqrt{2}}{\ell_{CORE}} \leq H_{BIAS} = \frac{N_{BIAS} \, I_{BIAS}}{\ell_{CORE}}$$

50 A/DIV.
R-F CURRENT

20 A/DIV.
CONTROL CURRENT

1 MILLISEC./DIVISION

50 A/DIV.
R-F CURRENT

20 A/DIV.
CONTROL CURRENT

100 MICROSEC./DIVISION

100 A/DIV.
BOTH
CURRENTS

2 MILLSEC./DIVISION 23,975 Hz

100 A/DIV.
ANTENNA
CURRENT 19,880 Hz

200 MICROSEC./DIVISION

ANTENNA TUNING SYSTEM AND METHOD

The government has rights in this invention pursuant to Contract No. N00123-80-C-0425 awarded by the United States Department of the Navy.

BACKGROUND OF THE INVENTION

The present invention relates to antenna tuning systems, being more particularly, though not exclusively, concerned with automatic and synchronous tuning of very low frequency (VLF) antennas to obviate the sensitivity of solid state or similar transmitters generating frequency shift-keyed modulation signals or the like to the deleterious effects of load mismatch caused by detuning, such that mismatched loads may be effectively and dynamically fed with high efficiencies.

The VLF band (say, 3–30 kHz) offers certain unique characteristics for reliable, worldwide communications. Propagation occurs mainly in the vertically polarized, ground-wave mode, which experiences very little attenuation as it travels in the earth-ionosphere waveguide, and is little affected by the ionospheric disturbances which often interrupt higher-frequency traffic. Unfortunately, however, VLF is difficult to radiate from ground-based antennas, the dimensions of which are limited, by practical necessity, to a small fraction of a wavelength. Excitation of an electrically short antenna requires the transmitter to supply large amounts of reactive power to localized, non-radiating modes. The reactive power may be hundreds of times the real power supplied, and owing to resistive losses which occur in the soil close to the antenna, only a fraction of the real power gets radiated.

VLF transmitting antennas typically consist of an insulated network of wires supported by towers at the highest practical altitude, fed from the ground by an insulated tower or downlead. The effective antenna height is essentially the physical height. The local electrostatic mode appears as a capacitance in series with the radiation and ground resistances; but the capacitive reactance can be cancelled at a single operating frequency with an appropriate series inductance. The Q of the resulting series-tuned circuit is often several hundred, and the resulting −3 dB bandwidth may be inconveniently narrow for frequency-shift-keyed (FSK) data transmission, especially at the lower frequencies. Until the advent of the present invention with its dynamic tuning, communication system designers were forced to accept VLF/LF antenna-system bandwith as a fundamental limitation on FSK signaling rates. Ground-based transmissions have been restricted to a few hundred baud, while airborne stations with their broader antenna bandwidths have operated at over a thousand baud.

While the simplest way to expand antenna system bandwidth is by adding series resistance, this approach degrades efficiency, and is economical only when a small improvement in bandwidth is needed. The only other practical means for bandwidth enhancement involves electronically varying the tuning inductance so that the antenna resonance tracks the excitation frequency provided by the transmitter. A variety of techniques for accomplishing this function have been tried, including permeability tuning, using a very large ferrite core (Jacob, M. I. and Brauch, H. N. "Keying VLF transmitters at high speed", Electronics, Vol. 27 (1954) No. 12, pp 148–151); and SCR switching with square-loop magnetic cores by the assignee of the present invention, "Controlled Antenna Reactor for Bandwidth Enhancement (CARBE)", RADC TR-74-161 (July 1974). In such prior dynamic tuning, one of the ferrite reactors, as described in the above Electronics article, is used in each of the two helix houses to increase the antenna bandwidth to 72 Hz, so that the radiated power on 17.8 kHz with 100 Hz frequency shift is about twice that obtained without dynamic tuning. Each reactor is housed in a large oil tank weighing 23 tons of which 3.75 tons are ferrite material. Though drive-circuit limitations have prevented the reactors from reaching their design levels of performance, at least the practical utility of dynamic tuning has been demonstrated.

More efficient drivers based on the use of SCRs and resonant charging have been developed, and it has been discovered that square-loop magnetic material may be operated under large-signal condition as a two-state switch. Far less core weight and volume is needed if the magnetic core is operated as a two-state switch. As an example, radiation of 1600 baud MSK with a 100 kW transmitter on 37.2 kHz has been achieved. The antenna bandwidth was less than one-fourth the frequency shift—truly an otherwise impossible signaling situation without the dynamic tuning of the present invention. Moreover, a modular dynamic tuning system has been achieved for VLF stations with dynamic tuning suited to the station's individual requirements, so that 200 baud signals may be transmitted efficiently on each assigned frequency, and with the frequency shift (100 Hz) and system bandwidth (160 Hz) comparable, so that reduced stress on vacuum-tube transmitters and greatly improved dc-to-rf conversion efficiency is achieved.

These benefits are particularly significant also in the development of solid-state VLF transmitters which are especially sensitive to load mismatch caused by detuning; with much of their promised operating efficiency and reliability otherwise being lost unless the antenna is synchronously tuned.

SUMMARY OF THE INVENTION

An object of the invention, accordingly, is to provide a new and improved dynamic tuning apparatus and method, particularly adapted for use with frequency-shift keyed VLF transmitters, that are not subject to the disadvantages above-mentioned of prior systems but that provide synchronous dynamic tuning with high efficiencies and with narrow-frequency spectrum.

A further object is to provide a novel dynamic antenna tuning apparatus of more general utility, as well.

Other and further objects will be explained hereinafter and are more particularly delineated in the appended claims.

In summary, from one of its broader viewpoints, the invention embraces a dynamic antenna tuning system for synchronous and automatic tuning of VLF antennas and the like operating with keyed transmitters, having, in combination, variometer means including a variable tuning inductance connecting the transmitter to the antenna; coupling network means including variable inductance connected to the variometer means; saturable core balanced magnetic switching means connected to switch the coupling network means; control current generator means comprising charging and discharging circuit means for generating control impulses to saturate and reset the magnetic switching means; and automatic circuit tuning means responsive to the frequency of the transmitter for causing successive and gradual variations of the variable tuning inductance of the variometer means and the variable inductance of the coupling network means to effect tuning of the antenna system to the desired radiated frequencies. Preferred and best mode embodiments and details are later presented.

BRIEF DESCRIPTION OF THE DRAWINGS

The invention will now be described with reference to the accompanying drawings, FIG. 1 of which is a block diagram of a preferred embodiment of the invention.

DESCRIPTION OF THE PREFERRED EMBODIMENTS

Figure 1:
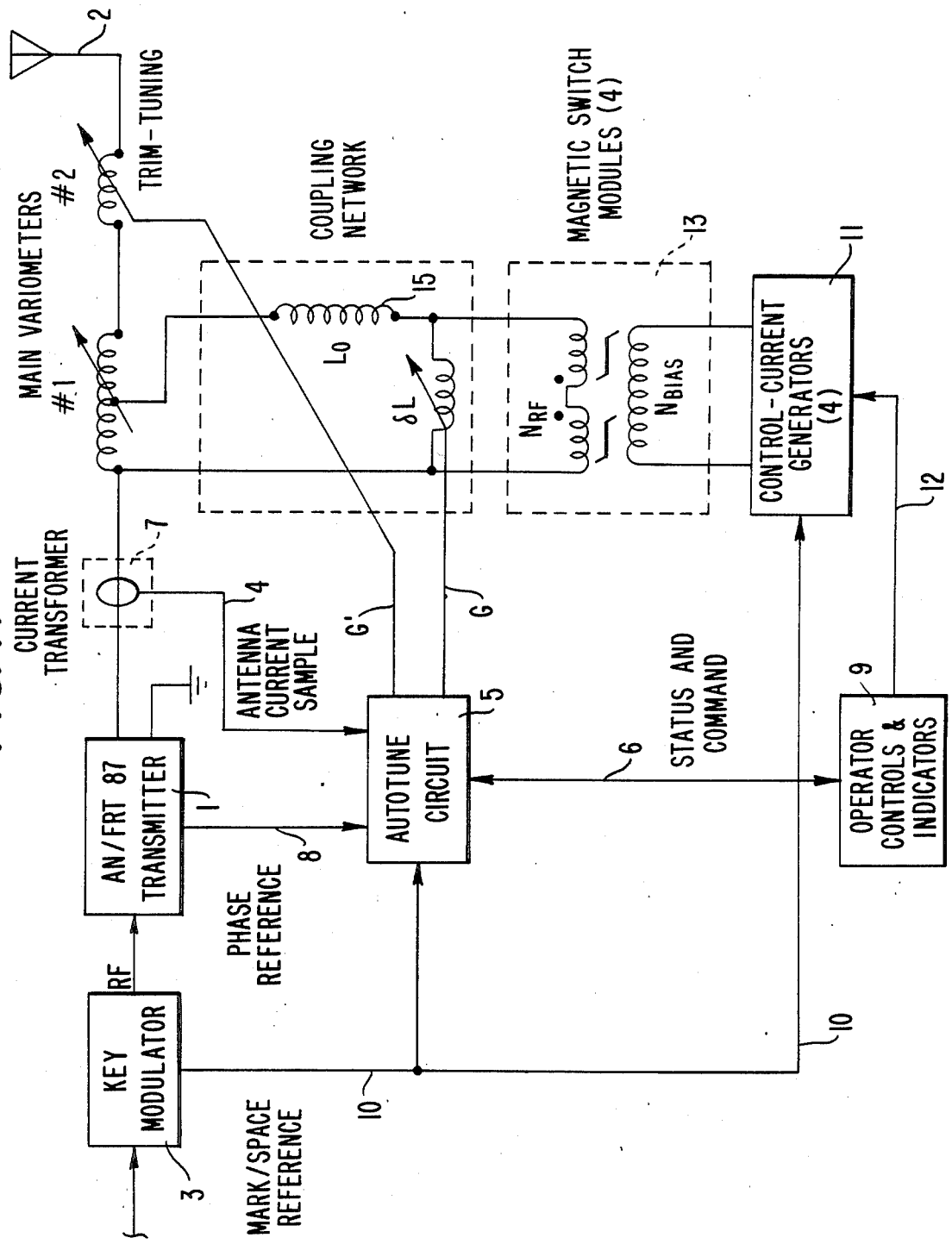

Referring to FIG. 1, the dynamic antenna tuning system is illustrated as applied to a VLF transmitter 1 (as of the Navy type AN/FRT 87) driven by a keyed modulator 3 as before described, the rf output of which is applied to the antenna 2 through main variometers #1 and #2 (trim), schematically shown variable under the control of an autotune circuit 5. Inputs to the autotune circuit 5 are the mark/space reference 10 from modulator 3, phase reference 8 from transmitter 1, antenna current sample 4 from current transformer 7, and status and command signals 6 from operator controls and indicators 9. Inputs to the control current generators 11 are the mark/space reference 10 from the modulator 3 and command signals 12 from the operator controls and indicators 9. The control current generators 11 control the magnetic switch modules 13, connected to a coupling network 15 comprising a series inductor $L_o$ and a shunt variable inductor $\delta L$, applied to the variometer element #1. The autotune circuit, as later explained, varies the trim tuning inductor #2 of the main variometer (schematically shown by the gang connection G') and the variable shunt inductor $\delta L$ of the coupling network 15. (shown by the gang connection G).

Figure 2:
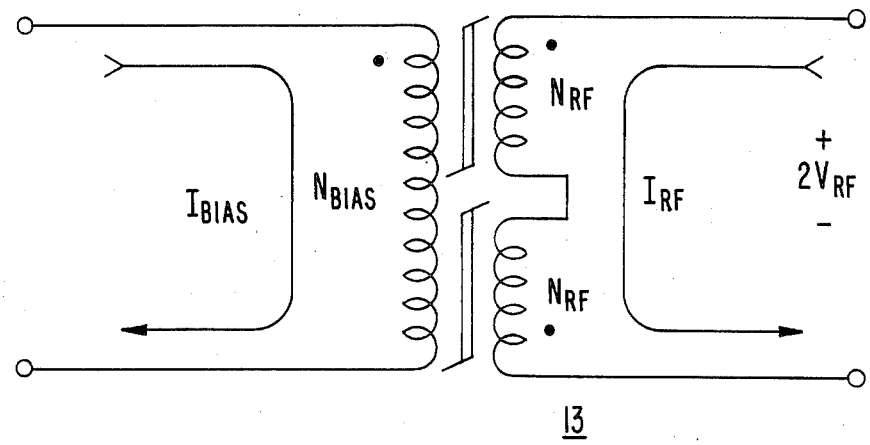
FIG. 2 is a circuit diagram of the balanced saturable-inductor magnetic switch of FIG. 1.
Figure 3A:
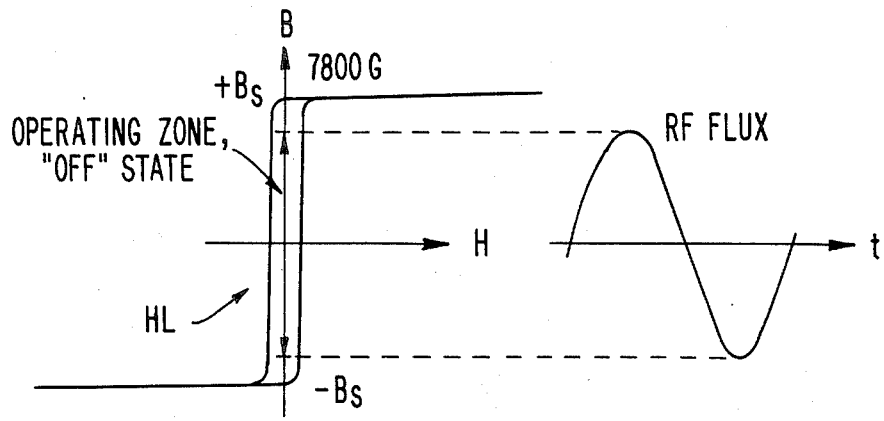
FIGS. 3A and B are graphs illustrating the hysterisis characteristics of square-loop magnetic material switching occurring in the switch of FIG. 2.
Figure 3B:
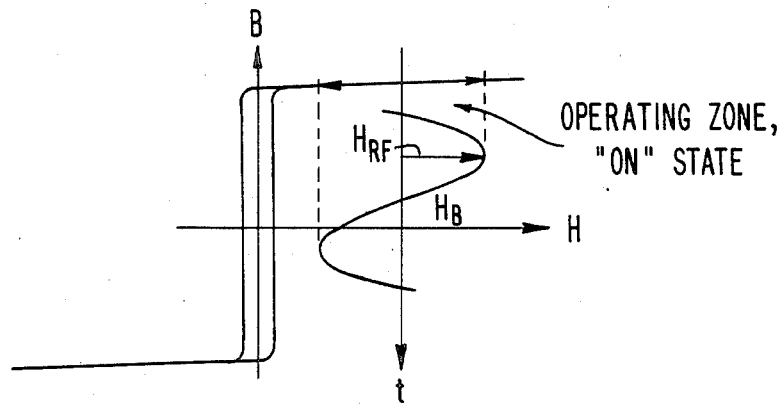

Thus, dynamic tuning is provided by switching the variable inductor $\delta L$ in and out of the coupling network 15 by means of the magnetic switches 13. The tuning of the antenna to the two frequencies representing mark and space is accomplished by means of the autotune circuit 5 together with variable inductor $\delta L$ and trim-tuning variable inductor #2. As before stated, the magnetic switch modules 13 embody saturable inductors in the circuit, as enlarged in FIG. 2. Two identical cores of magnetic tape are wound with the same number of rf turns ($N_{rf}$). A second control winding ($N_{bias}$) is placed over the wound rf cores in the series bucking sense, so that when the two cores are in the same magnetic state, the rf and control windings are decoupled. As shown in FIGS. 3A and B, the B-H loop for the preferred magnetic material, such as 80% Ni-20% Fe Permalloy magnetic tape, has two linear zones separated by a sharp transition. When the material is "off" or unsaturated (FIG. 3A), the wound core exhibits a very high inductance and draws only a small rf exciting current, sufficient to pump the cores operating point around the tall, narrow hysteresis loop HL. The expression given below FIG. 3A for $B_{rf}$ is Faraday's induction law. When saturated by an external d.c. magnetomotive force (MMF), the permeability of the tape core drops to unity and only the winding inductance remains. The core will stay saturated, or "on", so long as the bias MMF exceeds the peak rf MMF, as expressed by Ampere's circuital law in FIG. 3(B). Both the "off" and "on" states are characterized by excellent rf linearity and low rf loss. Harmonic voltages appear across the magnetic switch only during transitions between states.

The switching capacity of the magnetic material is such that a very capable VLF switch can be built with a small core volume, preferably vacuum-impregnated with transformer oil to provide insulation and free-convection cooling.

The magnetic switch 13 may be designed to hold off an rf voltage of up to, say, 10 kV rms when unsaturated, and carry up to 100 A rms of rf current when saturated with 70 A d.c. passing through the control winding. It has been found useful to define the "switched volt-ampere rating" of such a magnetic switch as the product of the off-state rms voltage times the on-state rms current, expressed in megavoltamperes (MVA). The magnetic switch 13 may, for example, be rated at 1.0 MVA over a 15-30 kHz band. Incipient core saturation sets the 10 kV limit at 15 kHz. More voltage can be held off at higher frequencies, but at the cost of higher core hysteresis losses. The saturated-state current capability is set by the control-current capacity of the companion generator circuit and by the combined rf and control winding losses.

As before described in connection with FIG. 1, the magnetic switch 13 is important to the electrical design of the dynamic tuning system of the invention; and the magnetic switch MVA needed to shift the antenna tuning by $\Delta f$ at the lowest operating frequency f is first determined. The tuned antenna can be modeled as a series equivalent RLC circuit, with most of the capacitance C being concentrated in the top-hat structure of the antenna 2. The total inductance L contains contributions from the tower and/or downleads as well as the tuning coils. The gross resistance R includes the resistances of the ground system and coils together with the radiation resistance.

The resonant-frequency shift $\Delta f$ caused by an inductance shift $\Delta L$ can be expressed in the following equivalent forms:

$$\Delta f = 2f\left(\frac{\Delta L}{L}\right) = 8\pi^2 f^3 C \Delta L$$

It can be shown that the total switching volt-amperes required to change the antenna tuning inductance by $\Delta L$ (henries) at an operating frequency f (Hz) and rms antenna current $I_{ant}$ (A) is independent of the tuning network design, and is given by:

$$VA = I_{ant}^2 (2\pi f)\Delta L = I_{ant}^2 (4\pi L)\Delta f$$
$$= I_{ant}V_{ant}\left(2\frac{\Delta f}{f}\right) = 4\pi \Delta f\, C_{ant}V_{ant}^2$$

The voltage $V_{ant}$ is approximately the top-hat-to-ground voltage. Often a VLF station will be antenna-voltage limited at the low frequencies, and transmitter-power limited at the high frequencies. In the voltage-limited band, the switched voltamperes for a fixed $\Delta f$ are constant. Above the crossover frequency, the switching volt-amperes decrease rapidly. Since the volt-ampere capacity of a given magnetic switch is a slowly increasing function of frequency, it is the low end of the operating band which is critical for design purposes.

Having determined the number of 1.0 MVA switch modules 13 needed for a given station, the next step is to design an appropriate inductive network 15 for coupling the switch bank 13 to the antenna circuit 2. Typically, the couping network 15 will be shunted across the segment of tuning inductance #1 immediately above the transmitter's output transformer. In the voltage-limited band where a coupling variometer is used at some stations to couple the transmitter mesh with the antenna mesh, this is a small segment of the total tuning inductance. A fixed output transformer may be used inside the transmitter to provide coupling when the required switching capacity is at its highest constant value; the voltage-and current-transfer ratios of the coupling network 15 must be exactly matched to the voltage and current capabilities of the magnetic switches 13. Above the crossover frequency, much more design latitude exists, since the declining antenna switched-volt-ampere requirement can be met with many combinations of off-state voltage and on-state current within the available switching capacity.

Figure 4:
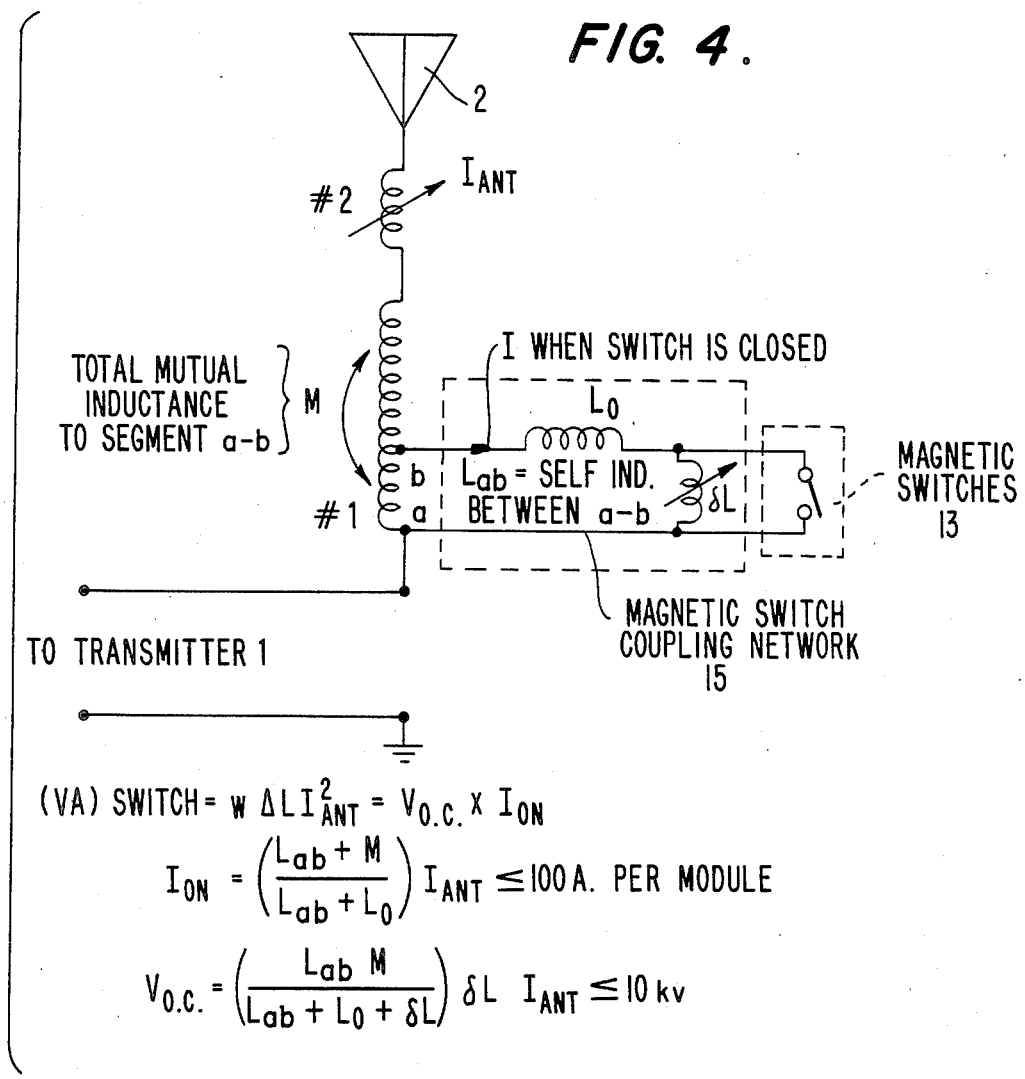
FIG. 4 is detailed circuit diagram of the antenna coupling network of FIG. 1.

The circuit and formula of FIG. 4 illustrate the calculations required for useful elementary coupling network. The magnitude of the series inductor $L_o$ determines how much of the antenna current passes through the switches 13 in the "on" state. When the switches 13 are "off", the combination of $\delta L$ and $L_o$ form a voltage divider between the main inductor tape a and b (#1) and the switches 13. The network of FIG. 4 is useful provided the open-circuit tap voltage exceeds the 10 kV capability of the magnetic switches 13 by a substantial margin. The challenge in coupling-network design is to accomplish the switch-matching functions at each of the station's assigned frequencies for the desired set of $\Delta f$'s, without major modifications to existing coils or the addition of large kVA, expensive new coils. Provision should also be made for trim-tuning of both high and low tones. In order for the balanced saturable-inductor circuit of FIG. 2 to be useful as a high-power VLF switch, a technique is required for changing the control-winding current rapidly back and forth in synchronism with the frequency changes in the transmitted signal. A substantial amount of inductive energy must be transferred in and out of the control winding at transitions, and a steady saturating MMF maintained for the variable-duration, high-frequency bits. The invention provides an efficient and reliable control-current generator 11 (FIGS. 1 and 5) utilizing SCRs and L-C resonant charging.

Figure 5:
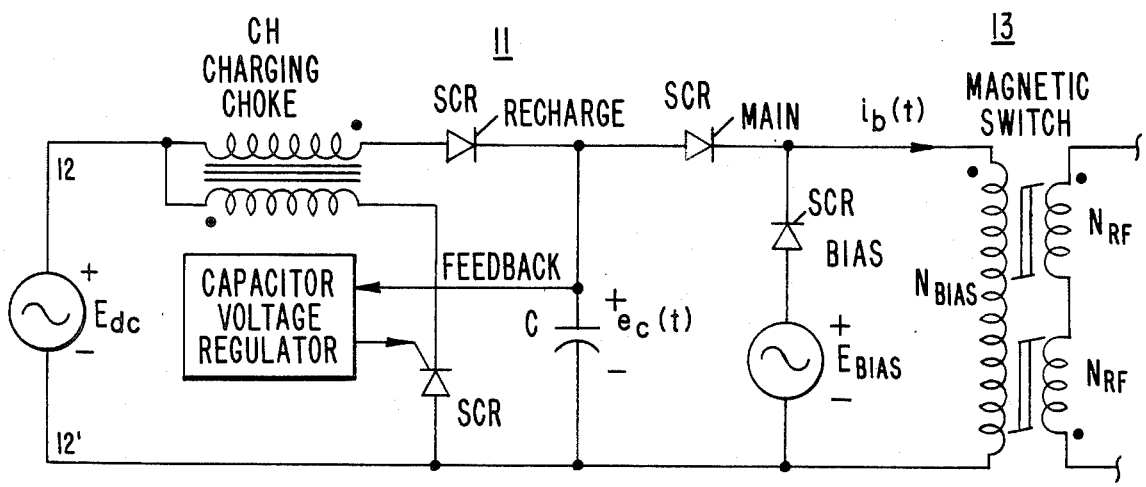
FIG. 5 is a circuit diagram of the control-current generator of FIG. 1.

For low-frequency transmissions, the control-current input to the magnetic switch 13 is zero, and because of the series-bucking winding configuration, essentially no rf voltage appears across the control winding $N_{bias}$, FIGS. 1 and 5. When sufficient control-winding current is present to maintain both cores in saturation throughout an rf cycle, similar bucking action occurs, and very little rf current flows in the control circuit. During transitions, the rf voltage pumps the core operating point back and forth around the corner of the hysteresis loop, FIG. 3A, causing a burst of rectified rf current in the control circuit.

Figure 6:
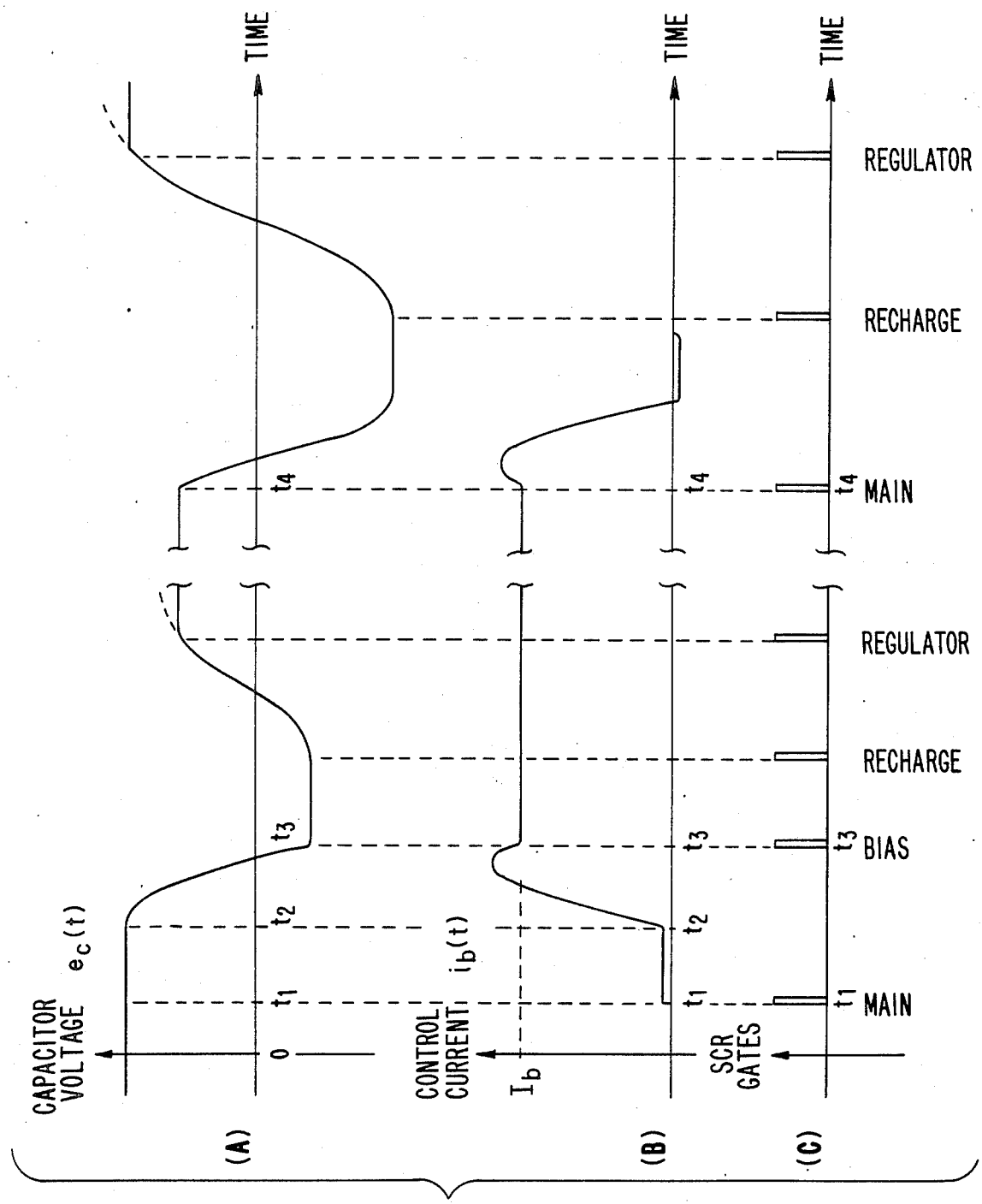
FIG. 6 waveforms A, B, C show a function of time of the capacitor voltage, control current and SCR gate output, respectively, of the control-circuit generator of FIG. 5.

FIG. 5 is a simplified circuit of a preferred control-current generator 11 and the relevant waveforms are sketched in FIG. 6. For simplicity of explanation, assume that no rf is present. At time t=0, FIG. 6A, the storage capacitor C is charged to a positive voltage, all SCRs are non-conducting, and the magnetic switch 13 is in its "off", unsaturated state. When the main SCR is gated at $t_1$, FIG. 6B, the full capacitor voltage $e_c(t)$ is applied to the control winding $N_{bias}$ of the switch 7, causing a small magnetizing current to flow while volt-time integral accumulates in the magnetic core material. When both cores reach saturation at time $t_2$, only the winding self-inductance remains, and a rapid resonant discharge of the storage capacitor C ensues. After slightly more than one-quarter of a cycle, at time $t_3$, the "bias" SCR is gated, which turns off the "main" SCR and connects a low voltage d.c. power supply $E_{bias}$ across the control winding $N_{bias}$ to maintain the winding current at a steady level $I_b$, FIG. 6B, until the next transition is called for. To prepare the circuit for the latter, the storage capacitor C is recharged to a moderate positive voltage via the "recharge" SCR, a second d.c. power supply $E_{d.c.}$, and voltage-regulating choke CH. The transition back to the low-current, low-frequency state begins at time $t_4$ with the gating of the "main" SCR (FIG. 6C), which turns off the "bias" SCR, and transfers the control-winding current back into the storage capacitor C, which is resonantly recharged to a large negative voltage. Negative volt-time integral is accumulated across the switch cores until the "main" SCR finally turns off, at which point the magnetic switch 13 has been reset to its open, unsaturated state. A second resonant recharge returns the storage capacitor voltage to its original positive level, in preparation for the next switching transition.

In accordance with the present invention, as distinguished from the prior SCR antenna switching proposals before referred to, which are subject to wide frequency spectrum results and require very fast SCR's and substantial KVA requirements, the SCR-capacitor-resonance charging circuit of FIG. 5 comprising the control current generator 11 of FIG. 1 that drives the magnetic switches 13, introduces an all-important lingering in the transition region, or gradual switching phenomenon (mark-to-space). This occurs as a result of operating at a relatively low control voltage, not sharply pushing the magnetic material on and off, so that the radio frequency goes through many cycles during the frequency transition—around the corner of the hysteresis loop, FIG. 3. From on-to-off, thus, the system spends many radio-frequency cycles going around the hysteresis top corner with many cycles occurring during the change from on to off in the magnetic amplifier. As an example, a one millisecond gradual switching transition may occur during about twenty radio frequency cycles at a frequency of 20 kHz.

This phenomenon employed by the invention results in obtaining a continuous switching change of frequency, wherein the magnetic cores operate in and out of saturation each cycle but with novel action in the antenna that results in linear-slope change, and with the slope variable by the control voltage on the magnetic-tape cores. The narrow spectrum of the FM signal attainable with the invention, as distinguished from the wide spectrum inherent in the abrupt SCR antenna switching of the described prior art, may involve a frequency shift that is one-half the bit rate employed. As an illustration, with 200 bits/second, the MSK (minimum shift keying) may involve 100 Hz frequency shift. Only the carrier and close side bands (say +200 Hz) will be involved with the rest of the spectrum repeated by the receiver. The abrupt switching of the said prior art, on the other hand, results in copious side bands, for example, for 1600 bits, a center frequency of 30 kHz in such systems will involve spectrum filling the whole band, such fast switching being associated with wide spectrum. The invention is particularly characterized, on the other hand, by gradual operation of the switching that gives rise to a very desirable narrow spectrum, generating harmonics only during transition and not during on and off.

In actual practice, four control-current generators 11 have been employed, supplying the switch 13 of FIG. 1 (also four modules) with bias current pulses of up to 80 A at keying rates up to 200 baud. The keying signal of the transmitter 1 ("KEY") and the digital communications emanated from a central control computer, being sent to the control logic via fibre-optic cables. Any circuit faults which occured in the control current generator 11 were reported to the central computer via the same link such that a spare on-line control current generator 11 and its companion magnetic switch 13 were then activated automatically.

Figure 7:
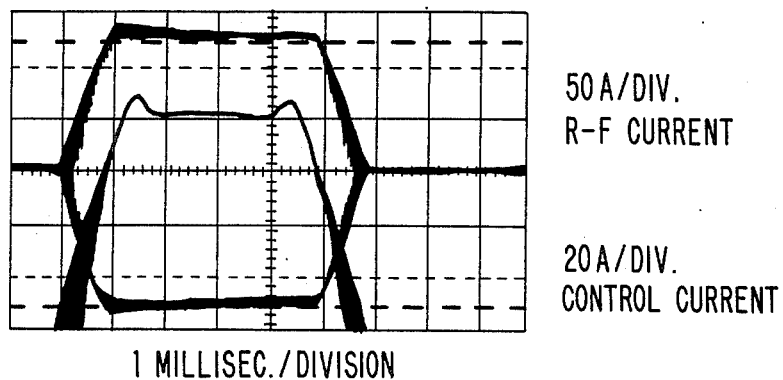
FIG. 7 is an oscillograph of the rf switch current (upper trace) and control current (lower trace) in the operation of the circuit.
Figure 8:
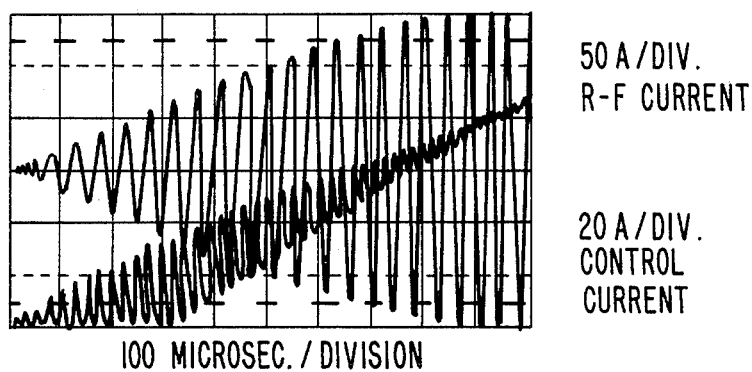
FIG. 8 is an oscillograph showing expanded low-to-high frequency-transition regions of the said rf switch current (upper trace) and control current (lower trace)

Some waveforms taken during test of the above-described magnetic-switch/control-current-generator pair 13-11 are presented in FIGS. 7-10. FIGS. 7 and 8 show the currents in the rf and control windings of the magnetic switch 13 when full-rated rf voltage and current were applied and 200 baud reversals were being sent. It should be noted how a full-wave-rectified component of the rf current appears on the control current during the frequency transitions, and how the rf winding current goes linearly up and down over a period of about 1 millisecond. Radio-frequency harmonics are effectively filtered out of the antenna circuit by the high-Q resonance at the fundamental frequency.

Figure 9:
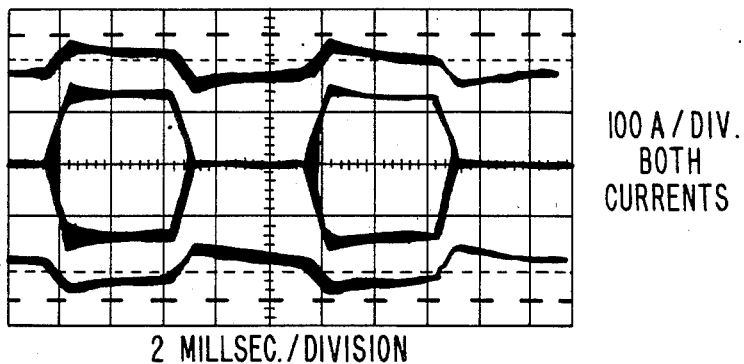
FIG. 9 is an oscillograph of the switch current (foreground) and antenna current (background)
Figure 10:
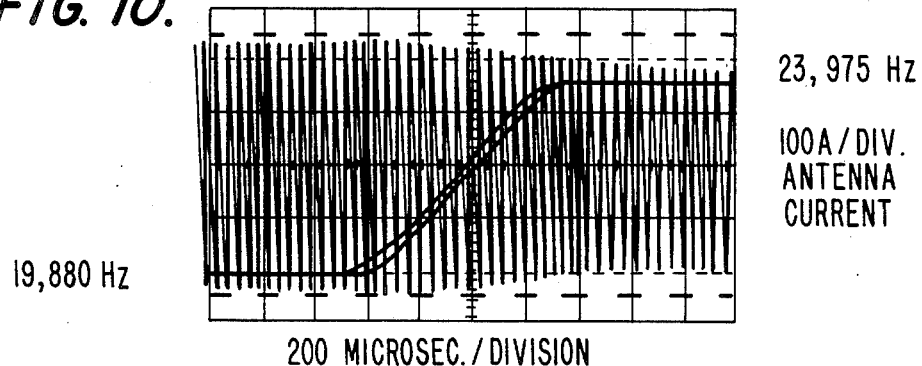
FIG. 10 is an oscillograph of the antenna current transition region.

FIG. 9 shows the r-f switch current and the (dummy) antenna current. The frequency shift was made very large (Fi=19.880 kHz to Fz=23.975 kHz) in order to provide the switch with a large kVA loading, without requiring an impractically high dummy-antenna current. Under these conditions, a large amplitude modulation necessarily occurs in the simulated antenna current. FIG. 10 illustrates an expansion of the antenna current wave together with voltages proportional to the instantaneous frequencies of the transmitter drive signal and the antenna current. The dynamic-tuning transition was tailored to match and track the frequency transition of the modulator 3 (FIG. 1). The sync-wave antenna current is shown in the background of FIG. 10; the straight-slant trace shows the transmitter drive frequency as it goes from 19.880 to 23.975 Hz; and the curvedslant (left) trace illustrates the antenna current's frequency as it follows that of the transmitter (right).

Through the technique of employing square-loop balanced magnetic switching 13 controlled by a current generator 11, involving capacitor discharge into the inductance to switch with antenna current sampling 4 aiding automatic variation of the coupling network shunt inductance δL and the main variometer trim tuning inductance #2, the gradual switching of the rf underlying the invention is achieved, making possible a narrow VLF frequency spectrum. The configuration of the invention, wherein the switches are at constant voltage and are all in parallel, enables modular assembly, with the resonant SCR-capacity technique generating the required high switching currents.

While preferred variometer and coupling network configurations have been described, clearly other networks may also be employed; and further modifications will also occur to those skilled in this art, such being considered to fall within the spirit and scope of the invention as defined in the appended claims.

What is claimed is:

1. A dynamic antenna tuning system for synchronous and automatic tuning of a very low frequency antenna and the like operating with a keyed very low frequency transmitter, having, in combination, variometer means including a variable tuning inductance connecting the transmitter to the antenna; coupling network means including variable inductance connected to the variometer means; saturable core balanced magnetic switching means connected to switch the coupling network means; control current generator means comprising charging and discharging circuit means for generating control impulses to saturate and reset the magnetic switching means; and automatic circuit tuning means responsive to the frequency of the transmitter for causing successive and gradual variations of the variable tuning inductance of the variometer means and the variable inductance of the coupling network means to effect tuning of the antenna system to the desired radiated frequencies.

2. An antenna tuning system as claimed in claim 1 in which the frequency of the transmitter is varied and the control current generator means is responsive to the frequency changes of the transmitter, and in which said magnetic switching means comprises control winding means the current in which, under the control of the control current generator means, changes rapidly back and forth in synchronism with frequency changes in the transmitter, with means for transferring inductive energy in and out of the control winding means at such transitions.

3. An antenna tuning system as claimed in claim 2 and in which said saturable core balanced magnetic switching means have saturable core hysterisis characteristics with transision region corners, and in which said control current generator means drives said saturable core balanced magnetic switching means around said corners during periods of time corresponding to many cycles of the frequency of said transmitter.

4. An antenna tuning system as claimed in claim 3 and in which said periods of time correspond to the order of 20 cycles of the frequency of said transmitter.

* * * * *